United States Patent
Lim et al.

(10) Patent No.: US 7,212,450 B2
(45) Date of Patent: May 1, 2007

(54) FERAM HAVING DIFFERENTIAL DATA (75) Inventors: Jae Hyoung Lim, Seoul (KR); Dong Yun Jeong, Chungcheongbuk-do (KR); Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,138

(22) Filed: Jun. 30, 2004

(65) Prior Publication Data
US 2005/0122762 A1    Jun. 9, 2005

(30) Foreign Application Priority Data
Dec. 9, 2003 (KR) .................. 10-2003-0089011

(51) Int. Cl.
*G11C 7/00* (2006.01)

(52) U.S. Cl. ..................... 365/190; 365/145
(58) Field of Classification Search ................ 365/145, 365/230.03, 207, 190
See application file for complete search history.

(56) References Cited

U.S. PATENT DOCUMENTS

| | | | | |
|---|---|---|---|---|
| 5,822,248 A | * | 10/1998 | Satori et al. ........... | 365/185.51 |
| 6,215,692 B1 | * | 4/2001 | Kang ..................... | 365/145 |
| 6,600,674 B2 | * | 7/2003 | Kasai .................... | 365/145 |
| 6,687,163 B2 | * | 2/2004 | Vega Ordonez ....... | 365/185.21 |
| 6,822,907 B2 | * | 11/2004 | Maruyama et al. .... | 365/185.21 |
| 6,826,712 B2 | * | 11/2004 | Ono ....................... | 714/6 |
| 6,930,908 B2 | * | 8/2005 | Hoya et al. ............ | 365/145 |
| 2003/0086312 A1 | | 5/2003 | Kang | |
| 2003/0137865 A1 | * | 7/2003 | Thompson et al. .... | 365/145 |

FOREIGN PATENT DOCUMENTS

JP    2002-288980    10/2002
KR    1020030037789 A    5/2003

* cited by examiner

Primary Examiner—Huan Hoang
Assistant Examiner—Kretelia Graham
(74) Attorney, Agent, or Firm—Heller Ehrman LLP (57) ABSTRACT

Disclosed is a non-volatile ferroelectric memory device having differential data, the device including: a plurality of cell array block groups having a hierarchy bit line structure and storing differential data; a common data bus being shared by a plurality of the cell array block groups, and transferring sensing voltages induced by the differential data; a column selection control unit selectively applying to the common data bus the induced sensing voltages of two main bit lines of the cell array block group according to the differential data; and a sense amp unit receiving the sensing voltages through the common data bus, comparing two sensing voltages induced by the differential data, and sensing the cell data. Therefore, the non-volatile ferroelectric memory device of the invention is capable of sensing a cell data more stably, independent of external factors and the state of a cell, by simultaneously sensing the stored data (differential data) in two unit cells and detecting the cell data.

6 Claims, 13 Drawing Sheets

FERAM HAVING DIFFERENTIAL DATA

BACKGROUND OF THE INVENTION

1. Field of the Invention

The present invention relates in general to a non-volatile ferroelectric memory device, and more particularly, to a non-volatile ferroelectric memory device capable of outputting a data more stably, independent of external factors and the state of a cell, by storing differential data in a memory cell array block having sub bit lines and main bit lines in a hierarchy bit line architecture, comparing the stored differential data with each other during a data read operation, and sensing the data.

2. Description of the Related Art

In general, a non-volatile ferroelectric memory, i.e., a FeRAM (Ferroelectric Random Access Memory), has a data processing speed equal to that of a DRAM (Dynamic Random Access Memory) and also is capable of preserving stored data even when the power is off.

The FeRAM and DRAM are memory devices with similar structures, but the FeRAM uses a capacitor made of a ferroelectric material to benefit a high residual polarization characteristic of the ferroelectric material. The residual polarization of the ferroelectric capacitor allows data to be maintained in an FeRAM memory cell and not erased even if an electric field applied to the memory cell is removed.

Figure 1:
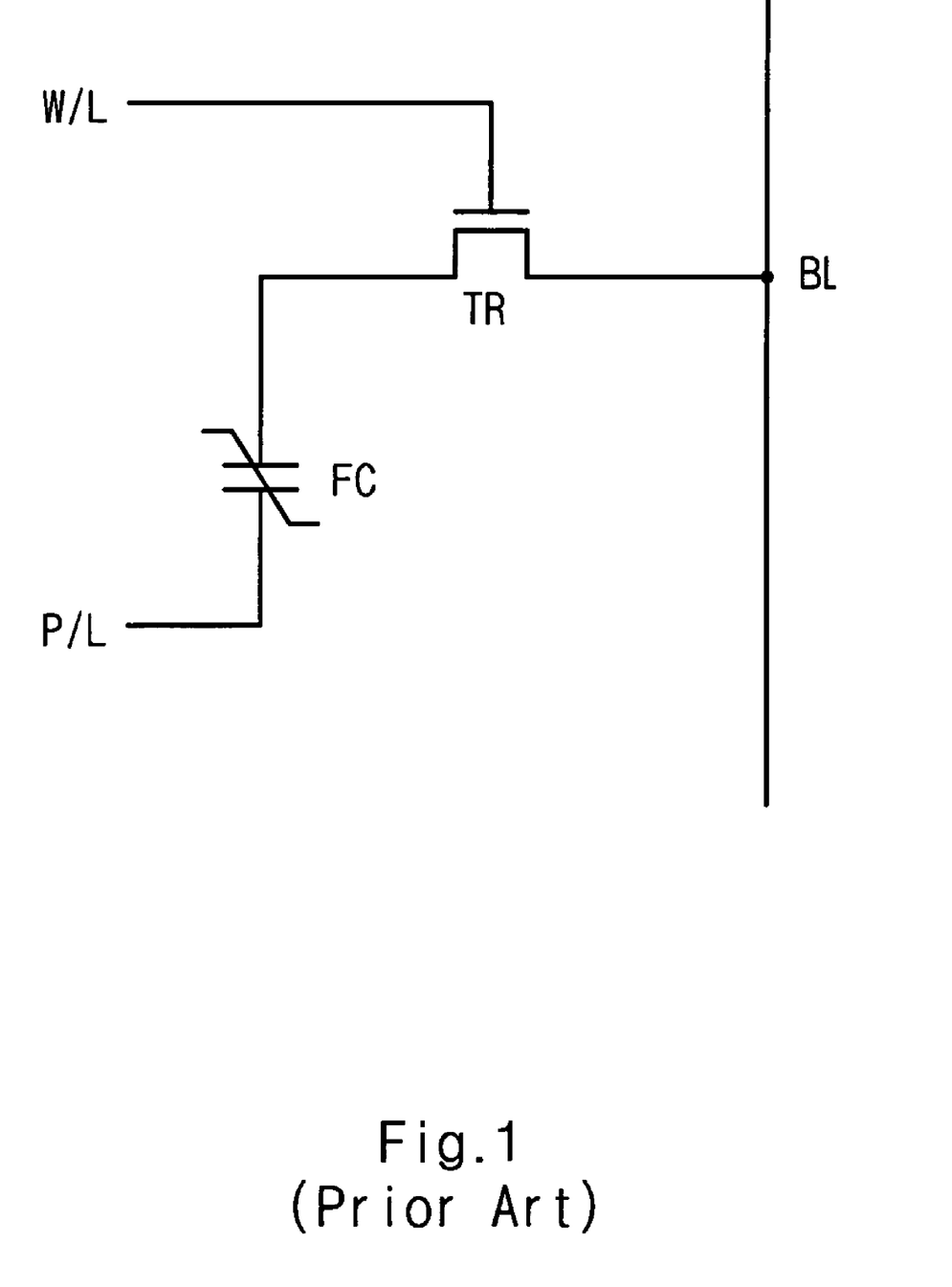
FIG. 1 is a schematic diagram of a unit memory cell of a related art 1T1C type non-volatile ferroelectric memory device.

FIG. 1 is a schematic diagram of a unit memory cell of a related art 1T1C type non-volatile ferroelectric memory device.

In the memory cell shown in FIG. 1, a bit line BL is formed in one direction and a word line WL is formed in a transversal direction with respect to the bit line BL. And, a plate line PL is formed in the same direction as the word line WL and at a predetermined distance therefrom. An NMOS transistor TR is disposed in such manner that a gate thereof is connected with the word line and a source thereof is connected with the bit line. A ferroelectric capacitor FC is disposed in such a manner that the first and second terminals thereof are respectively connected to the drain of the NMOS transistor TR and the plate line PL.

Figure 2:
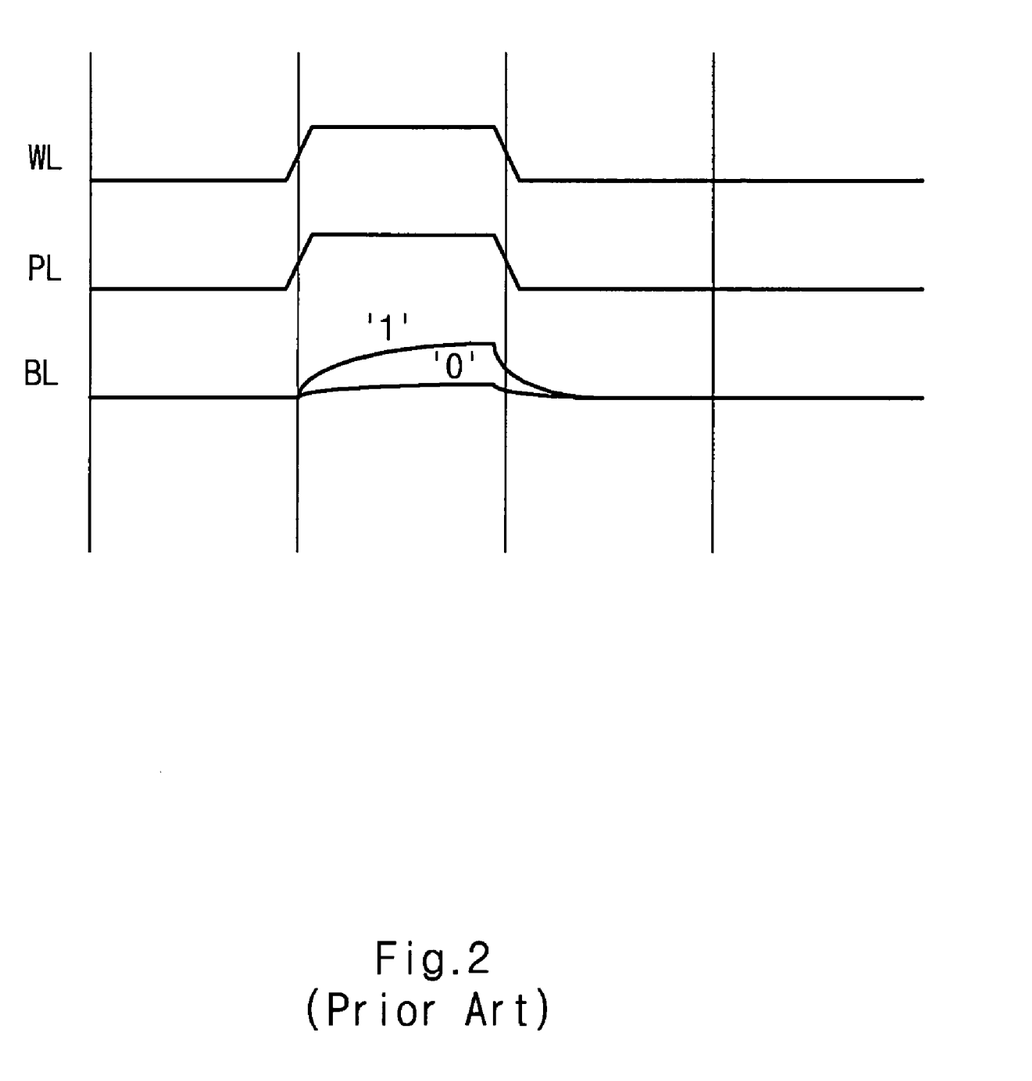
FIG. 2 is a timing diagram illustrating an operation of a memory cell in FIG. 1.

FIG. 2 is a timing diagram illustrating an operation of the memory cell in FIG. 1.

When a world line WL and a plate line PL in a selected cell are activated, a charge corresponding to a data "1" or "0" stored in the ferroelectric capacitor FC is applied to the bit line BL. In other words, a voltage in different yet designated levels according to the cell data is generated in the bit line BL.

Figure 3:
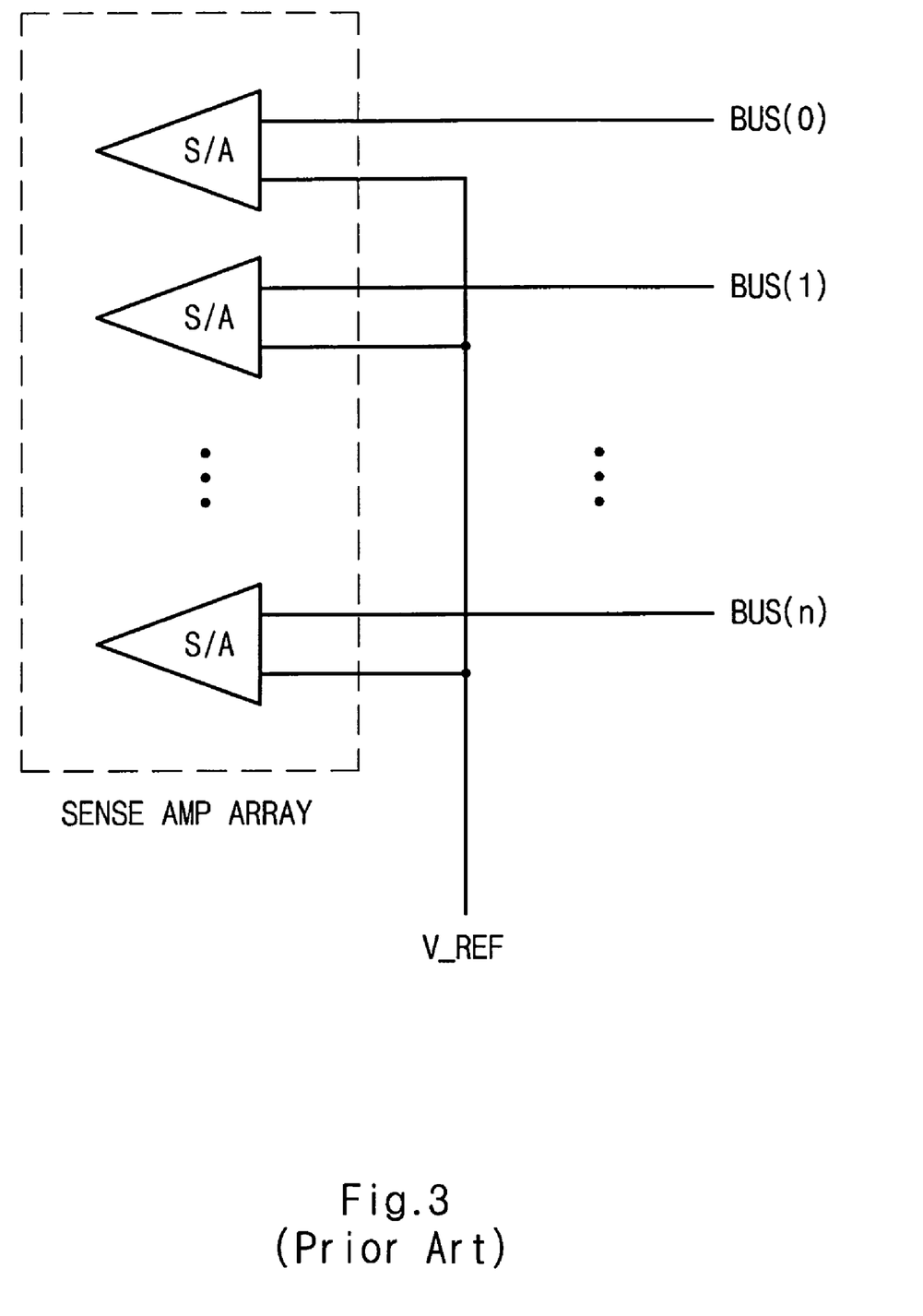
FIG. 3 is a schematic diagram of a sense amp array for sensing a cell data in a related art non-volatile ferroelectric memory device.

FIG. 3 is a schematic diagram of a sense amp array for sensing a cell data in a related art non-volatile ferroelectric memory device.

As shown in FIG. 3, the sense amp array includes a plurality of sense amps S/A in a one-to-one correspondence to data bus lines BUS (0)–BUS (n). Each sense amp S/A compares a sensing voltage applied through the data bus line with a pre-determined reference voltage V_REF, and senses a cell data. The sensing voltage on the respective data bus line is induced by a data stored in a selected unit cell by the activated word and plate lines WL, PL, as illustrated in FIG. 2.

However, in the above-described system where the reference voltage is compared with the sensing voltage induced by a unit cell in order to sense a data in the corresponding cell, noise due to an external impact is often generated in the reference voltage and as a result of this, a precise, accurate data sensing is not obtained. In addition, in the case the ferroelectric capacitor is in abnormal state (WEAK), the sensing voltage is reduced and thus, sensing a data in a corresponding cell cannot be done as accurately as possible. Unfortunately this problem gets worse when the driving voltage of a chip is low.

SUMMARY OF THE INVENTION

It is, therefore, an object of the present invention to provide a non-volatile ferroelectric memory device capable of sensing a cell data more stably, independent of external factors and the state of a cell.

To achieve the above object, there is provided a non-volatile ferroelectric memory device having differential data, the device including: a plurality of cell array block groups, a common data bus, a column selection control unit and a sense amp unit. Each cell array block group includes cell arrays having a hierarchy bit line architecture, in which one main bit line is selectively coupled to a plurality of sub bit lines, and a sensing voltage applied to the sub bit line according to a cell data is converted to the amount of current to induce a sensing voltage to the main bit line. And, the cell array block groups store the differential data of the cell data to be stored. The common data bus is shared by a plurality of the cell array block groups and transfers sensing voltages induced by the differential data. The column selection control unit selectively applies to the common data bus the sensing voltages induced to the main bit line by the differential data. The sense amp unit receives the sensing voltages through the common data bus, and compares two induced sensing voltages by the differential data to sense the cell data.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 4:
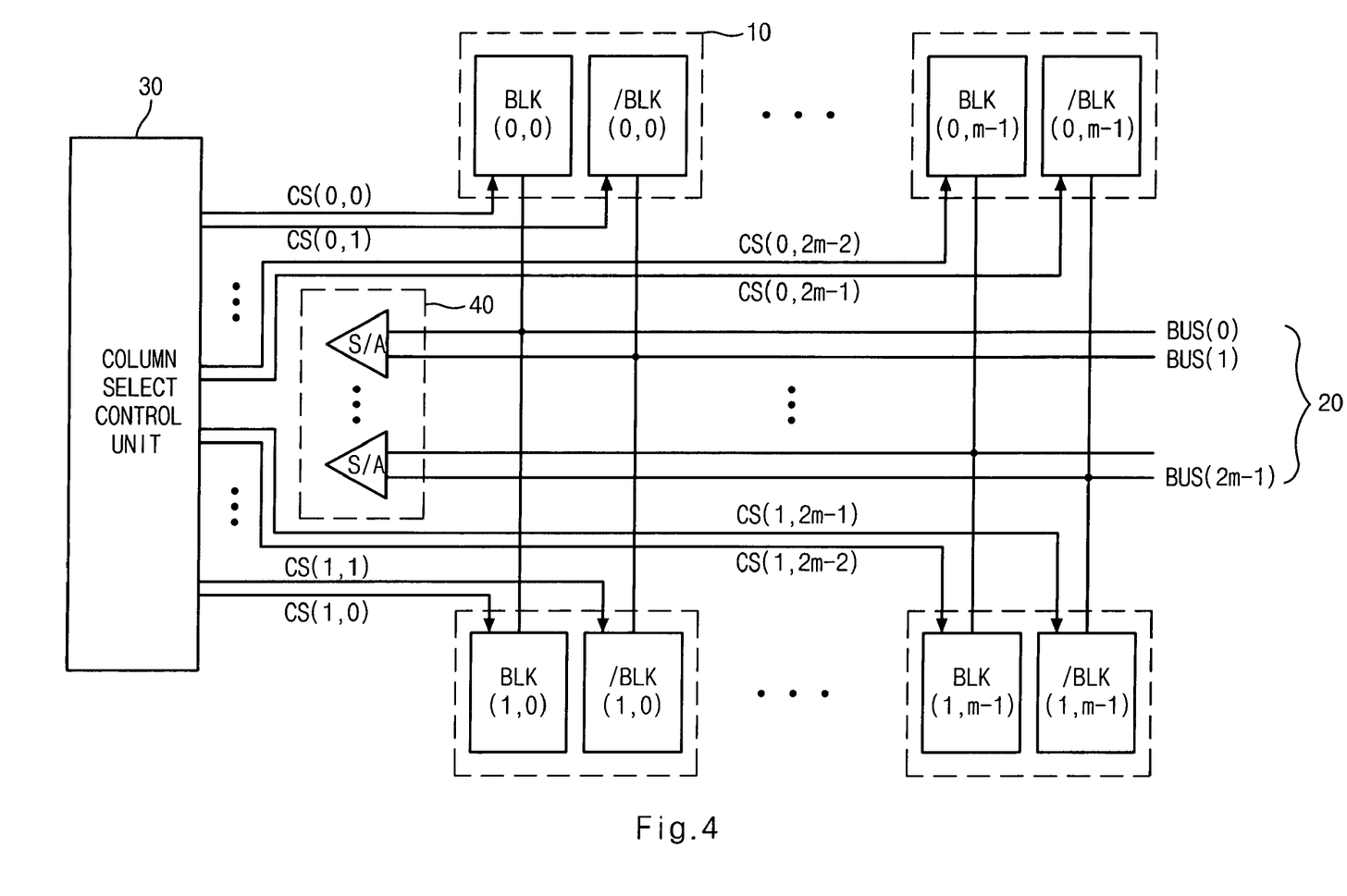
FIG. 4 is a schematic diagram of a non-volatile ferroelectric memory device according to a first embodiment of the present invention.

FIG. 4 is a schematic diagram of a non-volatile ferroelectric memory device according to a first embodiment of the present invention.

As shown in FIG. 4, the non-volatile ferroelectric memory device of the present invention includes a plurality of cell array block groups 10, a common data bus 20, a column selection control unit 30, and a sense amp unit 40.

The cell array block groups 10 includes two cell array blocks BLK (0,0), /BLK (0,0) which have the same structure and store opposite data (i.e. differential data). That is, two memory cells located at the same position in the cell array block BLK (0,0) and the cell array block /BLK (0,0) store differential data. Therefore, two memory cells (2T2C) are used to store one cell data, and the differential data stored in two unit cells are read from the cell array block group 10 or are written in the cell array block group 10 at the same time.

Each cell array block BLK (0,0), /BLK (0,0) has a hierarchy bit line architecture where a plurality of sub bit lines is selectively coupled to one main bit line, and a plurality of unit cells are connected to each of the sub bit line. Depending on whether or not a word line WL and a plate line PL are activated, a data in a selected unit cell is applied to the sub bit line. In such case, the cell array block BLK (0,0), /BLK (0,0) converts the sensing voltage on the sub bit line to the amount of the current to induce the sensing voltage on the main bit line.

The common data bus 20 includes a plurality of bus lines BUS (0)–BUS (2m-1). These but lines are shared by the cell array block groups 10 and are used for transferring a read data and a write data. The main bit line in the cell array blocks BLK, /BLK are selectively connected to the common data bus line 20, according to column selection signals CS (0,0)–CS (0, 2m-1), CS (1, 0)–CS (1, 2m-1).

The column selection control unit 30 selectively generates the column selection signals CS (0,0)–CS (0, 2m-1), CS (1, 0)–CS (1, 2m-1), and output them to the cell array blocks BLK, /BLK. Particularly, to read or write a data, the column selection control unit 30 of the invention activates simultaneously column selection signals corresponding to two cell array blocks BLK, /BLK of the cell array block group 10.

The sense amp unit 40 senses the sensing voltage of the common data bus 20 and identifies cell data. The sense amp unit 40 includes a plurality of sense amps S/As. Each sense amp S/A senses two sensing voltages induced to two bus lines by the differential data, and compares those two sensing voltages to identify cell data. In other words, unlike the related sense amp illustrated in FIG. 3 which compares the sensing voltage on each bus line with the reference voltage to identify cell data, the sense amp unit 40 of the present invention senses two sensing voltages induced by the differential data in the cell array block group 10 to identify cell data.

Figure 5:
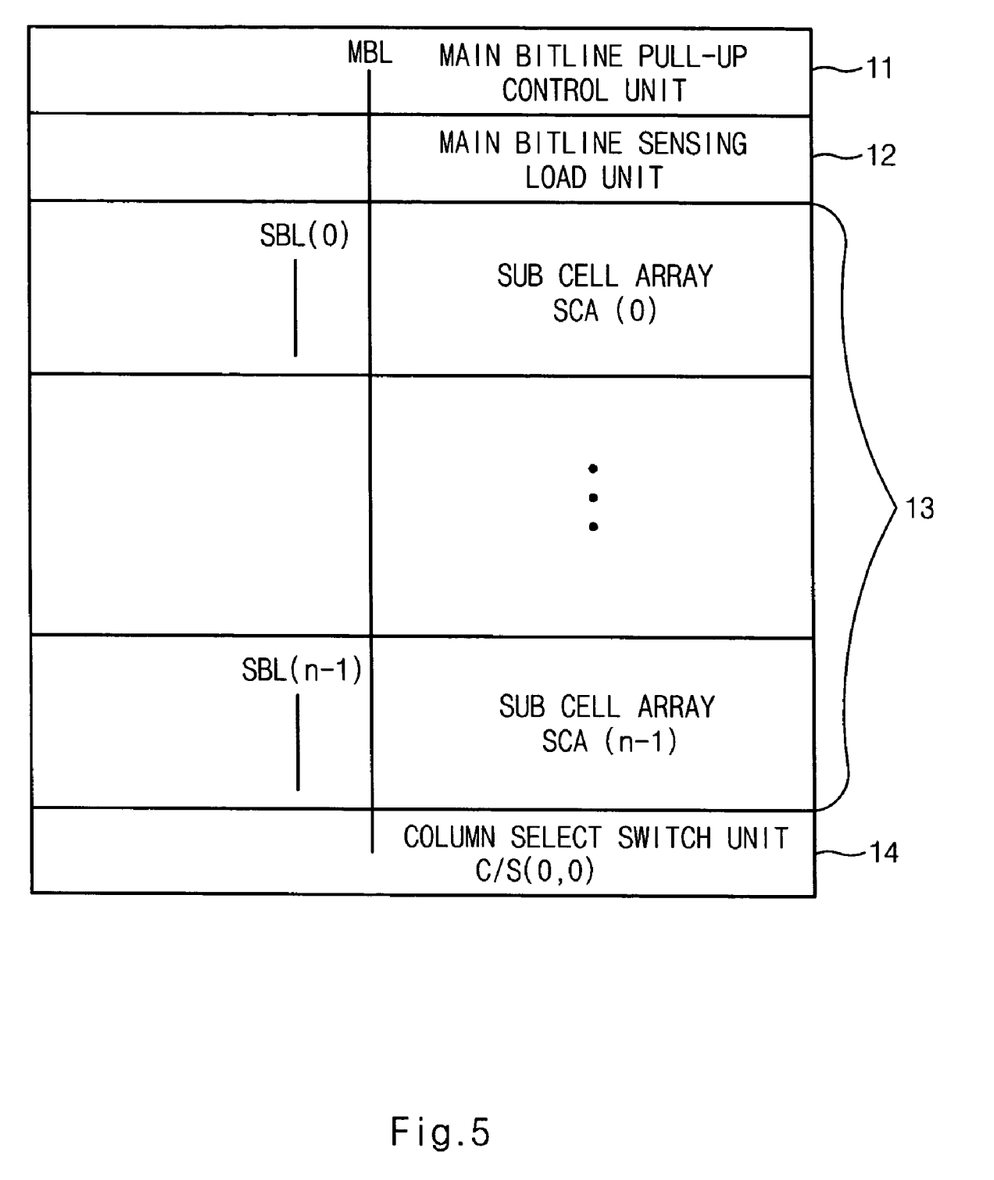
FIG. 5 is a schematic diagram briefly illustrating cell array blocks BLK, /BLK of FIG. 4.

FIG. 5 is a schematic diagram briefly illustrating the cell array blocks BLK, /BLK of FIG. 4, and FIG. 6 to FIG. 9 are circuit diagrams illustrating in detail the cell array blocks BLK, /BLK.

These two cell array blocks BLK, /BLK have the same structure and operation characteristic except that each cell array block stores differential data in two symmetric unit cells. In simplicity, therefore, only the structure of one cell array block BLK (0,0) will be explained below.

The cell array block BLK includes a main bit line pull-up control unit 11, a main bit line sensing load unit 12, a plurality of sub cell arrays 13, and a column selection switch unit 14.

In the cell array block BLK, there are main bit line MBL each is shared by the sub cell arrays SCA (0)-SCA (n-1), and a plurality of sub bit lines SBL (0)–SBL (n-1) each is located at the respective sub cell arrays SCA (0)–SCA (n-1), being coupled to the main bit line MBL. The main bit lines MBL are selectively connected to the common data bus unit 20 through the column selection switch unit 14.

Figure 6:
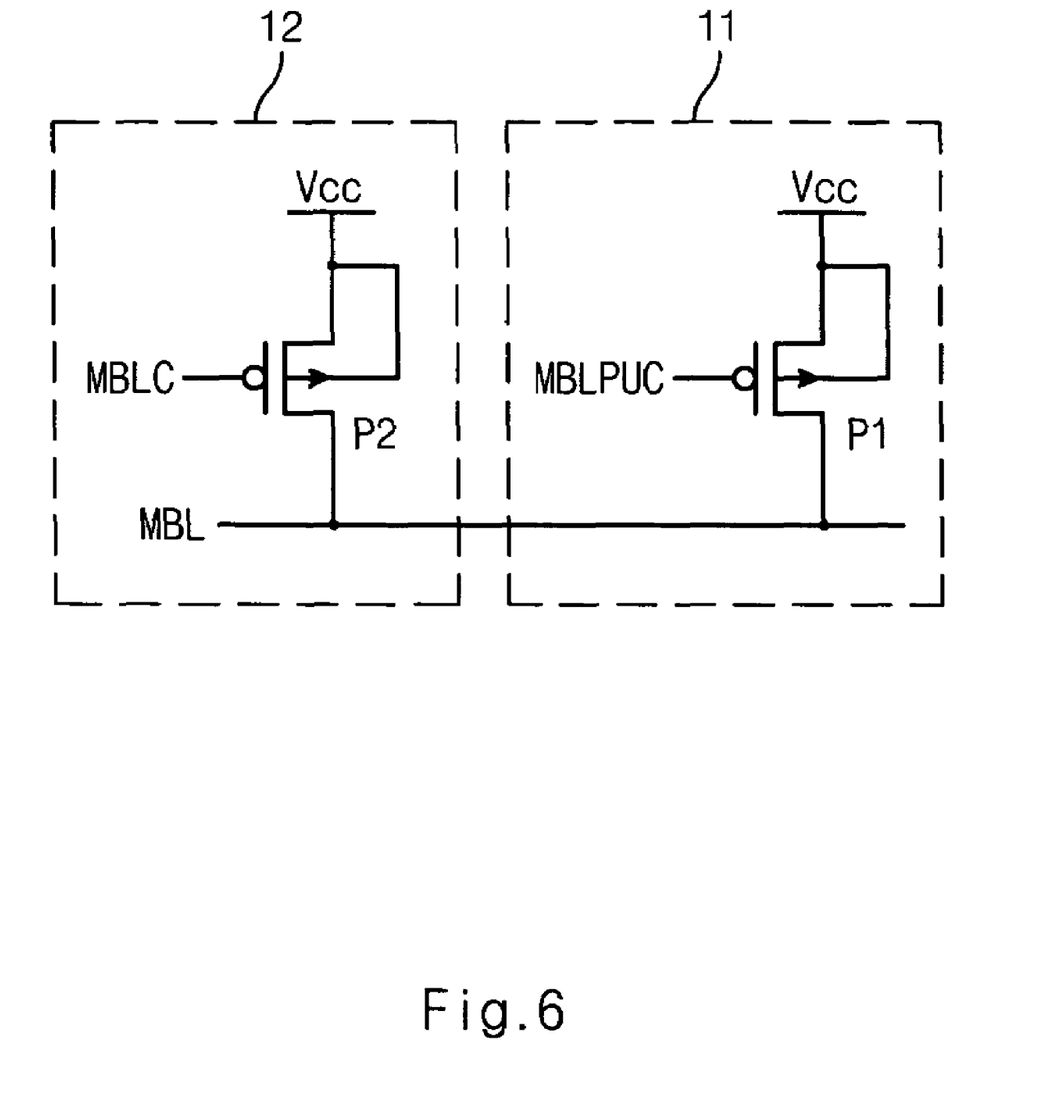
FIG. 6 is a detailed circuit diagram of a main bit line pull-up control unit and a main bit line sensing load unit of FIG. 5.

FIG. 6 is a detailed circuit diagram of the main bit line pull-up control unit 11 and the main bit line sensing load unit of FIG. 5.

The main bit line pull-up control unit 11 includes a PMOS transistor P1, pulling up the main bit line MBL during a pre-charge, according to a main bit line pull-up control signal MBLPUC. The source and drain terminals of the PMOS transistor P1 are respectively connected to the power voltage terminal VCC and the main bit line MBL, and the PMOS transistor P1 has a gate terminal to which the main bit line pull-up control signal MBLPUC is applied.

The main bit line sensing load unit 12 includes a PMOS transistor P2, controlling the sensing load of the main bit line MBL, according to a main bit line control signal MBLC. The source and drain terminals of the PMOS transistor P2 are respectively connected to the power voltage terminal VCC and the main bit line MBL, and the PMOS transistor P2 has a gate terminal to which the main bit line pull-up control signal MBLC is applied.

Figure 7:
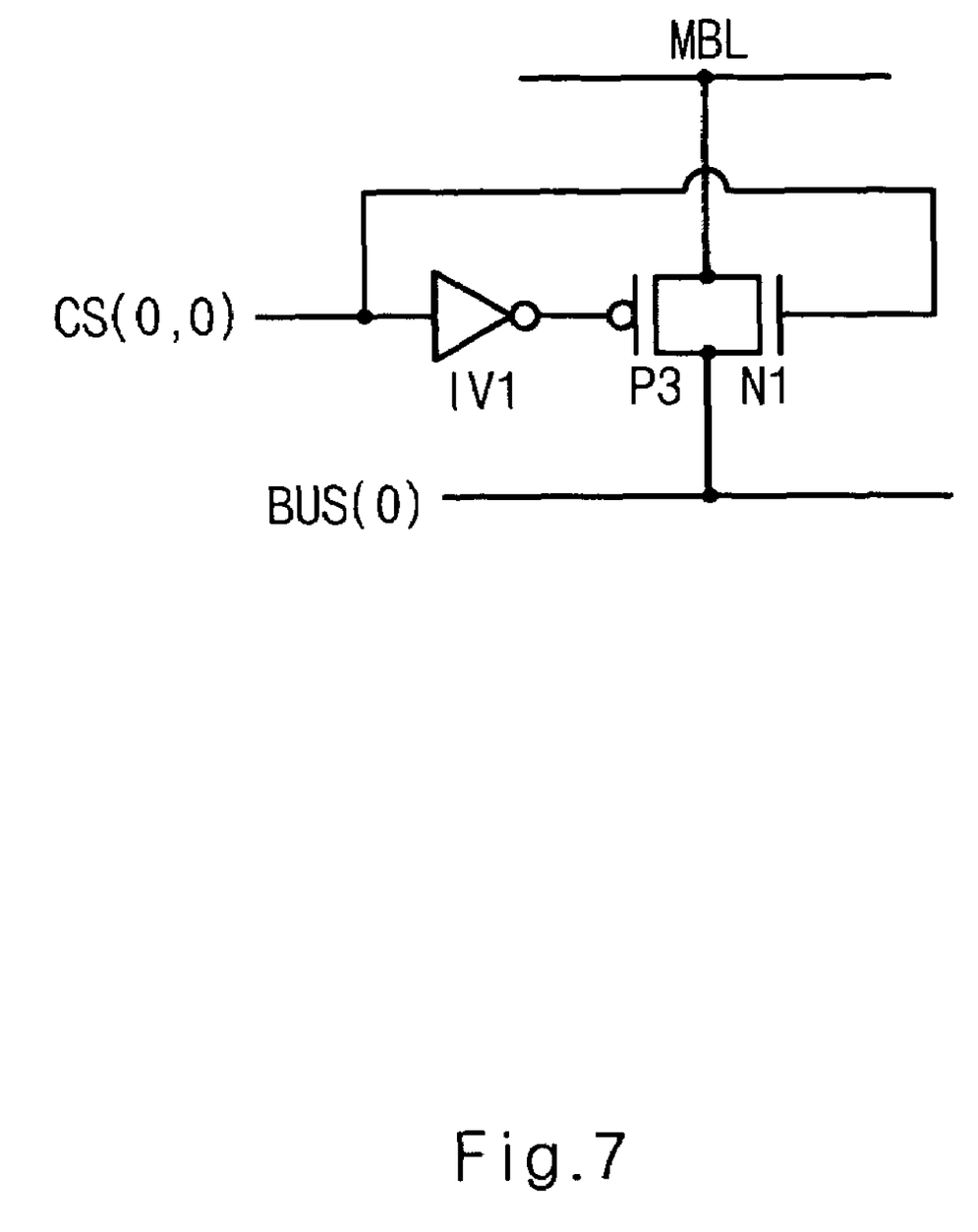
FIG. 7 is a detailed circuit diagram of a column selection switch unit of FIG. 5.

FIG. 7 is a detailed circuit diagram of the column selection switch of FIG. 5.

The column selection switch unit 14 selectively connects the main bit line MBL to the common data bus 20, according to the column selection signal CS (0,0). The column selection switch unit 14 includes an inverter IV1 for inverting the column selection signal CS (0,0), and transfer gates N1, P3 connected between the main bit line MBL and the common data bus 20 and turning on/off according to the column selection signals CS (0,0), /CS (0,0).

Figure 8:
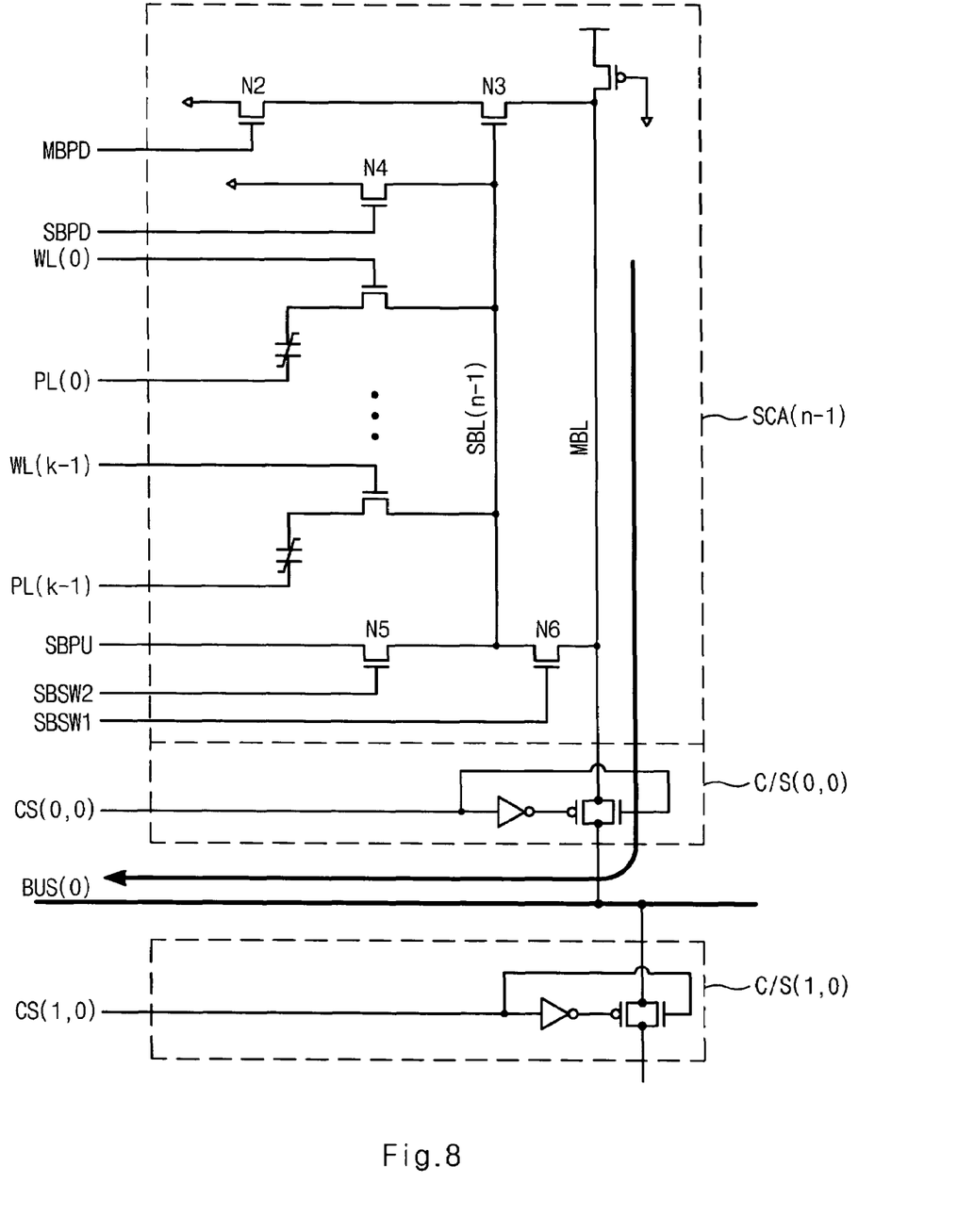
FIG. 8 is a detailed circuit diagram illustrating one sub cell array of FIG. 5.

FIG. 8 is a circuit diagram illustrating in detail one sub cell array SCA (n-1) out of the sub cell arrays SCA (0)–SCA (n-1) of FIG. 5.

When a sub bit line selection signal SBSWL is activated, an NMOS transistor N6 is turned on and a load on the main bit line MBL is adjusted to the level of a sub bit line SBL (n-1). In addition, when a sub bit line pull-down signal SBPD is activated, an NMOS transistor N4 is turned on and the sub bit line SBL (n-1) is adjusted to the ground voltage level.

A sub bit line pull-up signal SBPU is a signal for adjusting power supply to the sub bit line SBL (n-1), and a sub bit line selection signal SBSW2 adjusts a signal flow between a line for the sub bit line pull-up signal SBPU and the sub bit line SBL (n-1).

For example, to generate a high voltage to the sub bit line SBL (n-1), a higher voltage than the power voltage VCC is supplied as the sub bit line pull-up signal SBPU, and the sub bit line selection signal SBSW2 is activated. Following the activation of the sub bit line selection signal SBSW2, an NMOS transistor N5 is turned on and the sub bit line pull-up signal SBPU with a high voltage is provided to the sub bit line SBL (n-1).

An NMOS transistor N2 is connected between the ground voltage node and an NMOS transistor N3 and has a gate terminal to which a main bit line pull-down signal MBPD is applied. An NMOS transistor N3 is connected between the NMOS transistor N2 and the main bit line MBL, and has a gate terminal connected to the sub bit line SBL (n-1). While the main bit line pull-down signal MBPD is activated, the NMOS transistor N3 adjusts the amount of current flowing from the main bit line MBL to the ground voltage, according to the level of the sensing voltage on the sub bit line SBL (n-1). That is, the level of the sensing voltage on the main bit line MBL is determined in dependence of the amount of current flowing through the NMOS transistor N3.

For example, if the data value in a selected cell is high, a high voltage is applied to the sub bit line SBL (n-1). Accordingly, the amount of current flowing through the NMOS transistor N3 becomes larger, and the voltage level of the main bit line MBL is reduced to a great degree. On the contrary, if the data value in a selected cell is low, a low voltage is applied to the sub bit line SBL (n-1). Accordingly, the amount of current flowing through the NMOS transistor N3 becomes smaller. In this case, however, the voltage level of the main bit line MBL<0> is reduced only slightly. In short, the sensing voltage on the main bit line MBL is selectively applied to the BUS (0) according to the column selection signal CS (0,0), and is sensed by the sense amp unit 40.

Figure 9:
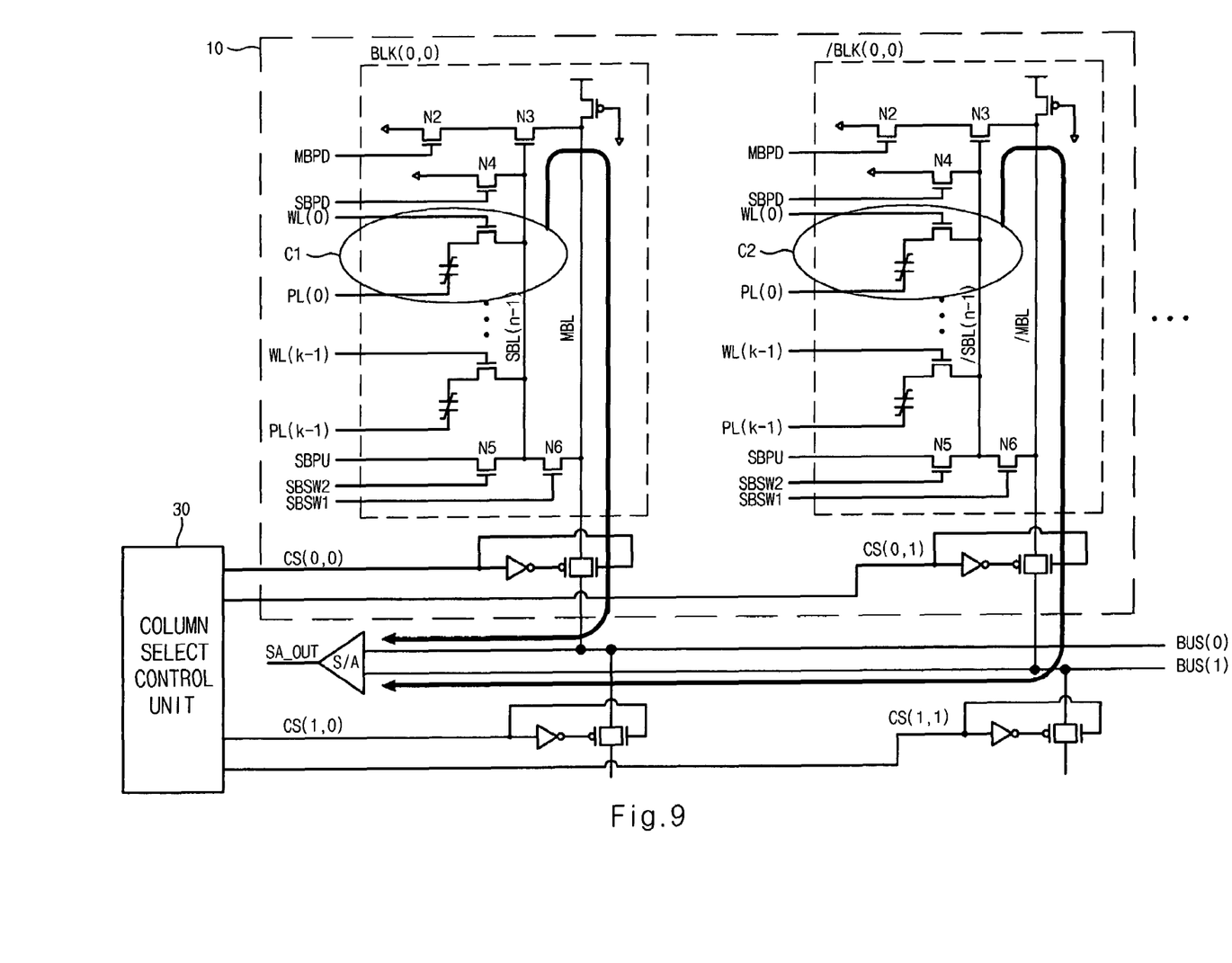
FIG. 9 is a circuit diagram illustrating a 2T2C circuit structure of FIG. 4 for data sensing.
Figure 10:
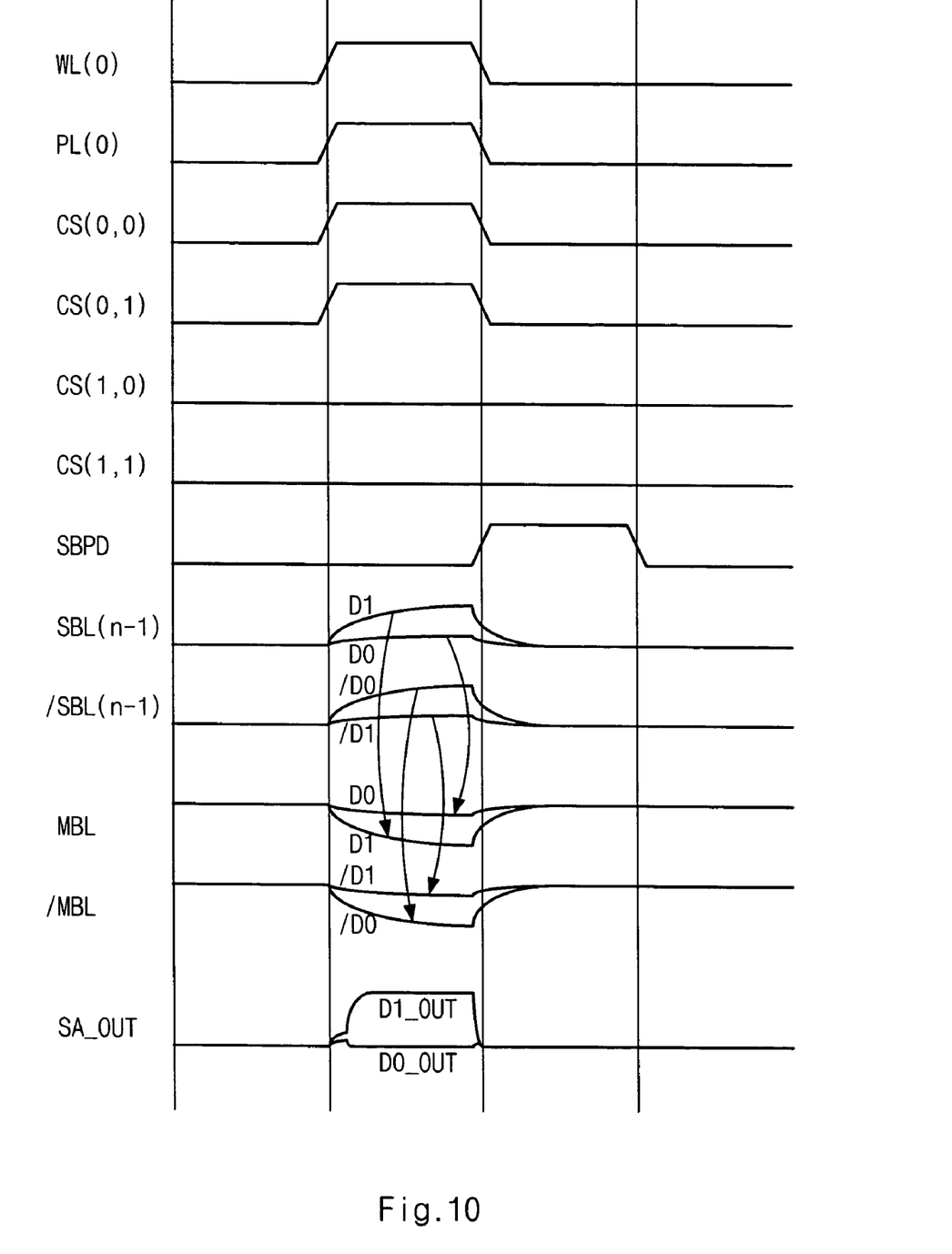
FIG. 10 is a timing diagram associated with an operation of FIG. 9.

FIG. 9 is a circuit diagram illustrating the 2T2C circuit structure of FIG. 4 for data sensing, and FIG. 10 is a timing diagram for describing the operation of FIG. 9.

As described above, one cell array block group consists of two cell array blocks BLK, /BLK with the same structures and stores differential data. And, a data read operation or a data write operation is simultaneously performed in the respective cell array block group 10. More specifically, the unit cell C1 in the cell array block BLK (0,0) and its corresponding unit cell C2 in the cell array block /BLK store differential data, and during the data read operation, the data in those two cells are outputted simultaneously to be sensed.

When the word line WL (0) and the plate line PL (0) are activated, the data D1 or D0 in the unit cell C1 is applied to the sub bit line SBL (n-1). Likewise, the data/D1 or /D0 in the unit cell C2 is applied to the sub bit line/SBL (n-1). According to the data applied to the sub bit lines SBL (n-1), /SBL (n-1), sensing voltages are respectively induced to the main bit lines MBL, /MBL through the NMOS transistor N3.

When the column selection signals CS (0,0), CS (0,1) are activated, the sensing voltages induced to the main bit lines MBL, /MBL are applied respectively to the common data buses BUS (0) and BUS (1). That is, the column selection control unit 30 generates two column selection signals CS (0,0) and CS (0,1) at the same time, to sense a data D1.

The sense amp S/A receives the sensing voltages of the common data buses BUS (0) and BUS (1) at the same time, and compares them to each other. Based on the comparison result, the sense amp S/A senses the data D1 or D0 stored in the unit cell C1. The sense amp S/A transfers the sensing result SA_OUT to a data buffer (not shown) in order to output the result outside.

When the data sensing is complete, the sub bit line pull-down signal SBPD is activated and the sub bit lines SBL (n-1), /SBL (n-1) are pulled down.

In short, because the differential data stored in two unit cells are compared for data sensing, although the ferroelectric capacitor of one of the unit cells is in abnormal state (WEAK), data sensing can be performed accurately. Moreover, because the reference voltage is not used for data sensing, no problems associated with the generation of the reference voltage occur in the present invention.

Figure 11:
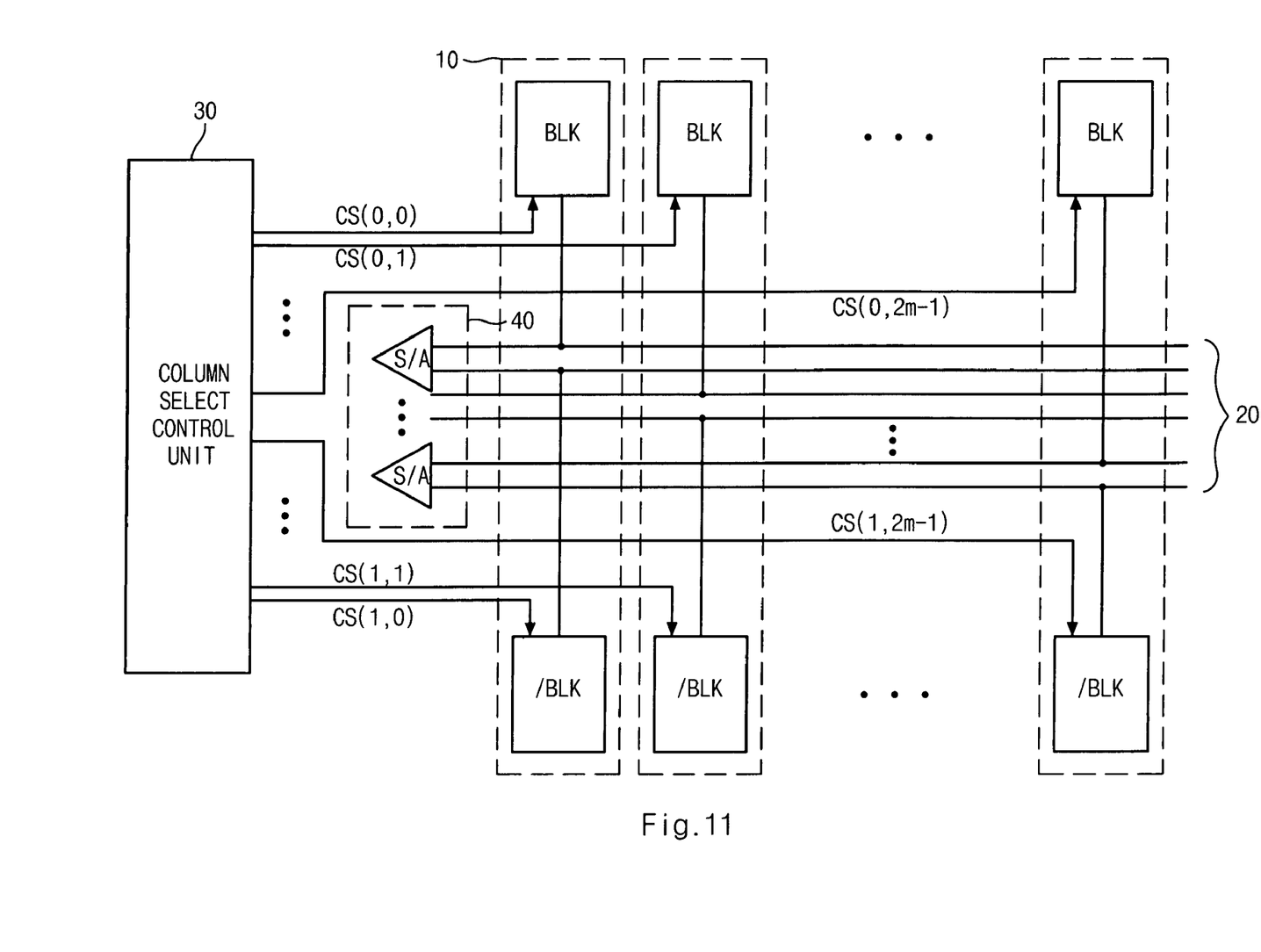
FIG. 11 is a schematic diagram of a non-volatile ferroelectric memory device according to a second embodiment of the present invention.

FIG. 11 is a schematic diagram of a non-volatile ferroelectric memory device according to a second embodiment of the present invention.

In the first embodiment, the respective cell array block group 10 comprises two adjacent cell array blocks. In the second embodiment, however, two cell array blocks BLK, /BLK in the respective cell array block group 10 are vertically symmetric with respect to the common data bus 20.

Therefore, the column selection control unit 40 in the second embodiment activates the column selection signals CS (0,0) and CS (1,0) at the same time.

Figure 12:
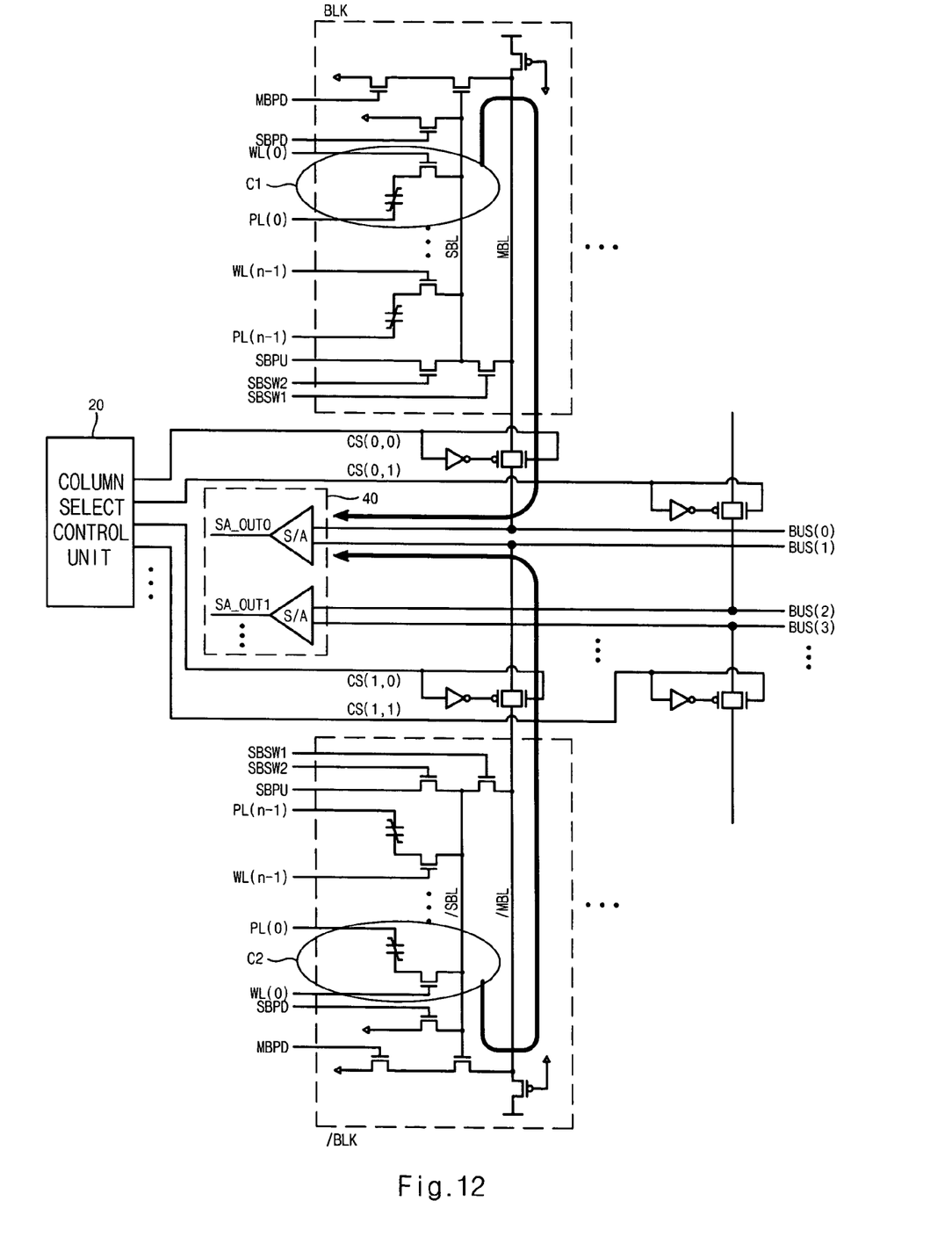
FIG. 12 is a circuit diagram illustrating a 2T2C circuit structure of FIG. 11 for data sensing.
Figure 13:
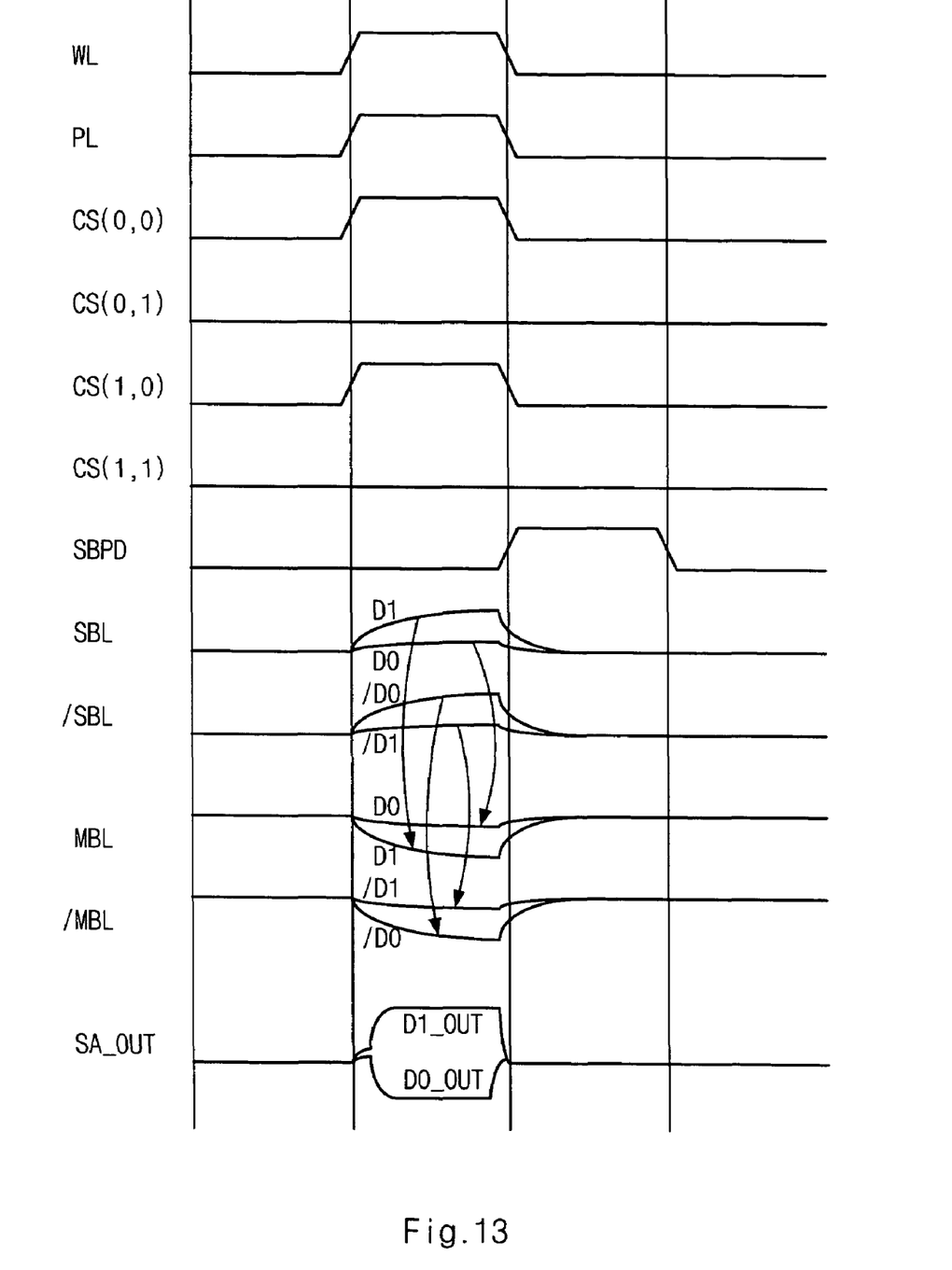
FIG. 13 is a timing diagram associated with an operation of FIG. 12.

FIG. 12 is a circuit diagram illustrating the 2T2C circuit structure of FIG. 11 for data sensing, and FIG. 13 is a timing diagram for describing the operation of FIG. 12.

When the word line WL (0) and the plate line PL (0) are activated, the data D1 or D0 in the unit cell C1 is applied to the sub bit line SBL. Likewise, the data /D1 or /D0 in the unit cell C2 is applied to the sub bit line /SBL. According to the data applied to the sub bit lines SBL, /SBL, sensing voltages are respectively induced to the main bit lines MBL, /MBL.

When the column selection signals CS (0,0), CS (1,0) are activated, the sensing voltages induced to the main bit lines MBL, /MBL are applied respectively to the common data buses BUS (0) and BUS (1). The sense amp S/A receives the sensing voltages of the common data buses BUS (0) and BUS (1) at the same time, and compares them to each other. Based on the comparison result, the sense amp S/A senses the data D1 or D0 stored in the unit cell C1. Then the sense amp S/A transfers the sensing result SA_OUT 0 to a data buffer (not shown) in order to output the result outside.

When the data sensing is complete, the sub bit line pull-down signal SBPD is activated and thus, the sub bit lines SBL, /SBL are pulled down.

In conclusion, according to the non-volatile ferroelectric memory device having differential data of the present invention, two unit cells are used to store differential data, and to detect the cell data, the differential data in those two unit cells are sensed simultaneously. Therefore the non-volatile ferroelectric memory device of the present invention can be advantageously used for sensing cell data more stably, independent of external factors and the state of a corresponding cell.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A non-volatile ferroelectric memory device comprising:
a plurality of cell array block groups each including a first cell array block and a second cell array block, wherein the first cell array block and the second cell array block each has a hierarchy bit line architecture with one main bit line being selectively coupled to a plurality of sub bit lines to induce a sensing voltage on the main bit line, wherein the first cell array block including a plurality of first unit cells which store a true data, wherein the second cell array block including a plurality of second unit cells which store a complement data, wherein the complement data is opposite to the true data; a sense amp unit amplifying a first sensing voltage on a first main bit line of the first cell array block and a second sensing voltage on a second main bit line of the second cell array block;

a common data bus transferring the first sensing voltage on the first main bit line of the first cell array block and the second sensing voltage on the second main bit line of the second cell array block to the sense amp unit; and a colunm selection control unit selectively transferring the first sensing voltage and the second sensing voltage to the common data bus in response to a first column selection signal and a second column selection signal, respectively.

2. The device according to claim 1, wherein the plurality of second unit cells of the second cell array block each is activated simultaneously with the corresponding first unit cell of the first cell array block, wherein each first unit cell and the corresponding second unit cell are connected by a same word line.

3. The device according to claim 1, wherein the first cell array block and the second cell array block are disposed adjacent to each other at an upper or lower part of the common data bus.

4. The device according to claim 3, wherein the column selection control unit selectively connects the first main bit line of the first cell array block and the second main bit line of the second cell array block to the common data bus in response to the first colunm selection signal and the second column selection signal to transfer the first sensing voltage and the second sensing voltage to the common data bus at the same time.

5. The device according to claim 1, wherein the first cell array block and the second array block are disposed symmetrically with respect to the common data bus.

6. The device according to claim 5, wherein the column selection control unit selectively connects the first main bit line of the first cell array block and the second main bit line of the second cell array block to the common data bus in response to the first column selection signal and the second column selection signal to transfer the first sensing voltage and the second sensing voltage to the common data bus at the same time.

* * * * *